United States Patent [19]
Kempke et al.

[11] Patent Number: 5,930,359
[45] Date of Patent: Jul. 27, 1999

[54] CASCADABLE CONTENT ADDRESSABLE MEMORY AND SYSTEM

[75] Inventors: Robert Alan Kempke, Tempe, Ariz.; Anthony J. McAuley, Bloomfield, N.J.; Michael P. Lamacchia, Gilbert, Ariz.

[73] Assignee: Motorola, Inc., Schaumburg, Ill.

[21] Appl. No.: 08/717,557

[22] Filed: Sep. 23, 1996

[51] Int. Cl.⁶ ............................ H04K 1/02; H04K 1/12; H04L 9/00; H04L 1/12; G11C 15/00
[52] U.S. Cl. ............................ 380/9; 380/59; 380/50; 711/108; 365/49
[58] Field of Search ............................ 711/108; 365/49; 380/9, 56, 59

[56] References Cited

U.S. PATENT DOCUMENTS

| | | | |
|---|---|---|---|
| 3,679,977 | 7/1972 | Howson | 375/290 |
| 5,226,082 | 7/1993 | Kustka | 380/46 |
| 5,414,707 | 5/1995 | Johnston et al. | 370/395 |
| 5,442,702 | 8/1995 | Van Doijen et al. | 380/23 |
| 5,454,094 | 9/1995 | Montove | 711/108 |
| 5,574,875 | 11/1996 | Stansfield et al. | 395/403 |
| 5,598,115 | 1/1997 | Holst | 326/119 |
| 5,638,315 | 6/1997 | Braceras et al. | 365/49 |
| 5,646,878 | 7/1997 | Samra | 365/49 |
| 5,649,149 | 7/1997 | Stormon et al. | 395/435 |
| 5,696,930 | 12/1997 | Garetz et al. | 395/439 |
| 5,726,942 | 3/1998 | Yoneda et al. | 365/208 |
| 5,841,874 | 11/1998 | Kempke et al. | 380/50 |

*Primary Examiner*—Gail O. Hayes
*Assistant Examiner*—Hrayr A. Satadian
*Attorney, Agent, or Firm*—James A. Coffing; Bradley J. Botsch; John C. Scott

[57] ABSTRACT

A system for a pipeline cascaded content addressable memory CAM system for sequentially processing input data includes an input register, a CAM core, cascade logic and an output register. As the memory association functions produce matches in the CAM core, the cascade logic in parallel composites data associated with each matching CAM core. Each cascade processes a separate data input simultaneously then passes on the cumulative results to the next stage.

25 Claims, 6 Drawing Sheets

- IF ADDRESS_VALID_PREV=0 AND THERE IS NO MATCH IN THIS CHIP:
  ADDRESS_VALID_NEXT=0
  ADDRESS_NEXT[19:0]=ADDRESS_PREV[19:0]+NUMBER OF WORDS IN THIS CHIP

- IF ADDRESS_VALID_PREV=0 AND THE FIRST MATCH IN THIS CHIP IS AT LOCATION AA:
  ADDRESS_VALID_NEXT=1
  ADDRESS_NEXT[19:0]=ADDRESS_PREV[19:0]+AA

- IF ADDRESS_VALID_PREV=1 (WHETHER THIS CHIP HAS A MATCH OR NOT):
  ADDRESS_VALID_NEXT=1
  ADDRESS_NEXT[19:0]=ADDRESS_PREV[19:0]

CASCADABLE CONTENT ADDRESSABLE MEMORY AND SYSTEM

FIELD OF THE INVENTION

The present invention relates generally to semiconductor Content Addressable Memory (CAM) and systems, and more particularly, to a pipelined cascadable CAM device, and a system using a plurality of such devices in cascade.

BACKGROUND OF THE INVENTION

Content addressable memory devices (CAMs) are extremely valuable in providing associative look-up based on contents of incoming data. A CAM is pre-loaded with a predefined data set, consisting of data to be compared, and optionally, data to be output when a match is found, or alternatively, the address where the match is found. The output data or address can be output as an index to the requesting device, or both the address and data can be output for each match.

One problem incurred in using CAMs is that the construction of CAM chips requires multiples of the number of transistors to implement than standard read/write random access memory (RAM) would require. Thus, CAM chips are usually much smaller in depth size than RAM chips. Therefore, the capacity of a single CAM chip is frequently inadequate to provide for the necessary associative look-ups. Thus, it becomes necessary to use multiple CAM chips in some sort of cascaded or interconnected manner to provide greater depth.

Current binary CAM devices are using nearly 4 million transistors and have reached a memory size of 2k by 64. However, ATM and other applications require much more memory, such as 128k by 64. This requires the cascade of 64 of the 2K×4 CAMs. Current CAM devices present a propagation delay of around 80 ns per CAM. Cascading 64 CAMs creates a match propagation and data compare rate delay in the microseconds, which is unacceptable. High data rates which require 128k of CAM currently do not function effectively.

Another major problem with this approach is that there is a variable latency in this architecture, where the time taken to find a match is widely variable from associative look-up to associative look-up, due to the fact that there is uncertainty as to how many CAM chips in the chain will have to be accessed, one at a time in turn, until a match is found. CAM data input lines must be run in parallel to all of the chips in the cascade chain, and control logic and intercoupling must be provided between the multiple chips in the cascade chain.

This configuration is ineffective for handling multiple CAM matches for a single input. Data to be recognized by the system as acceptable in a CAM compare may be within a range. Therefore, it is efficient for a single CAM location to accommodate a range of data. This, however, can ultimately create multiple matches for a single input.

A parallel CAM configuration can handle multiple matches, but this requires an onerous subsystem and is very slow. Processing is normally done by the processor that loaded the data initially. Therefore, the system is at a standstill until the processor is free to load more data.

Another prior art attempt at greater CAM system efficiently couples the input and output data in parallel and chip control logic in series. Here each CAM chip passes the control down the line to the next chip serially. Naturally, the first CAM chip is idle while each successive chip compares the input word. As stated earlier, cascading 64 CAM chips for a required application creates a slow system due to this bottleneck. Each added CAM chip adds a propagation delay to the system, 64 chips would result in a minimum of 64 propagation delays between input and output. This type of system also requires a controller to synchronize the input and output of data since the combinational logic in the control creates indeterminate delays.

In a parallel data, serial control system, if no match is found in a first CAM chip, it passes data to the next chip and the first CAM chip goes idle until possibly every CAM location is checked. Allowing the majority of the circuits to idle during a search is an inefficient use of CAM chips. Current cascaded CAMs are also slow because after the lookup process is complete, masking, handshaking, and housekeeping is required and also performed in series. While these functions are being performed, the memory association circuits are again idle. No processing can occur until an output from the system is produced and new data is loaded. This so called "wait and see" approach is much too slow for the currently desired data transfer rate. Each added stage compounds the CAM lookup delay.

The prior art does not provide the capability of reading out multiple CAM location matches within a CAM chip or system. Indeed, multiple matches within an associative memory device create bus contention or bus conflict from every match location trying to output data at the same time.

In prior art systems, after attaining a memory address from the CAM lookup tables, auxiliary RAM is sometimes used to retrieve further needed data. This function requires external processing and a plurality of address lines. As CAM usage and memory requirements are growing, there is a need to increase density and to maintain or increase system speed, without the problems and shortcomings from idle circuits and unpredictable latency.

DETAILED DESCRIPTION OF A PREFERRED EMBODIMENT

The present invention provides a pipelined CAM cascade system for memory association devices. The system provides sequential pipelined processing of input data within each stage (chip) and as a system. This is accomplished by each cascade stage performing a lookup and supplying an output to combinational logic if a match is found, then passing the input data to the next stage. Each stage processes a separate input word to the next stage simultaneously with other stages. After the input word is processed, each stage outputs the word to the next stage and a new word is accepted for processing.

In accordance with one aspect of the present invention, data is processed in a plurality of cascaded CAMs using combinational logic in parallel with the memory association functions, providing for the input word to be associated with data as it traverses the cascade. In a preferred embodiment, an input word is output from every CAM stage each clock cycle (after an initial loading latency), allowing immediate usage of the first stage by the next input word. This creates a pipelined configuration where input data is loaded, and processed data is simultaneously output every clock cycle. Each CAM chip (i.e., stage) is itself a multiple stage pipelined device. The first stage thus processes new input data concurrently with the output stage providing output of processed data. At the final CAM stage, after the initial latency of loading the pipeline, new match results are generated every clock cycle.

Figure 1:
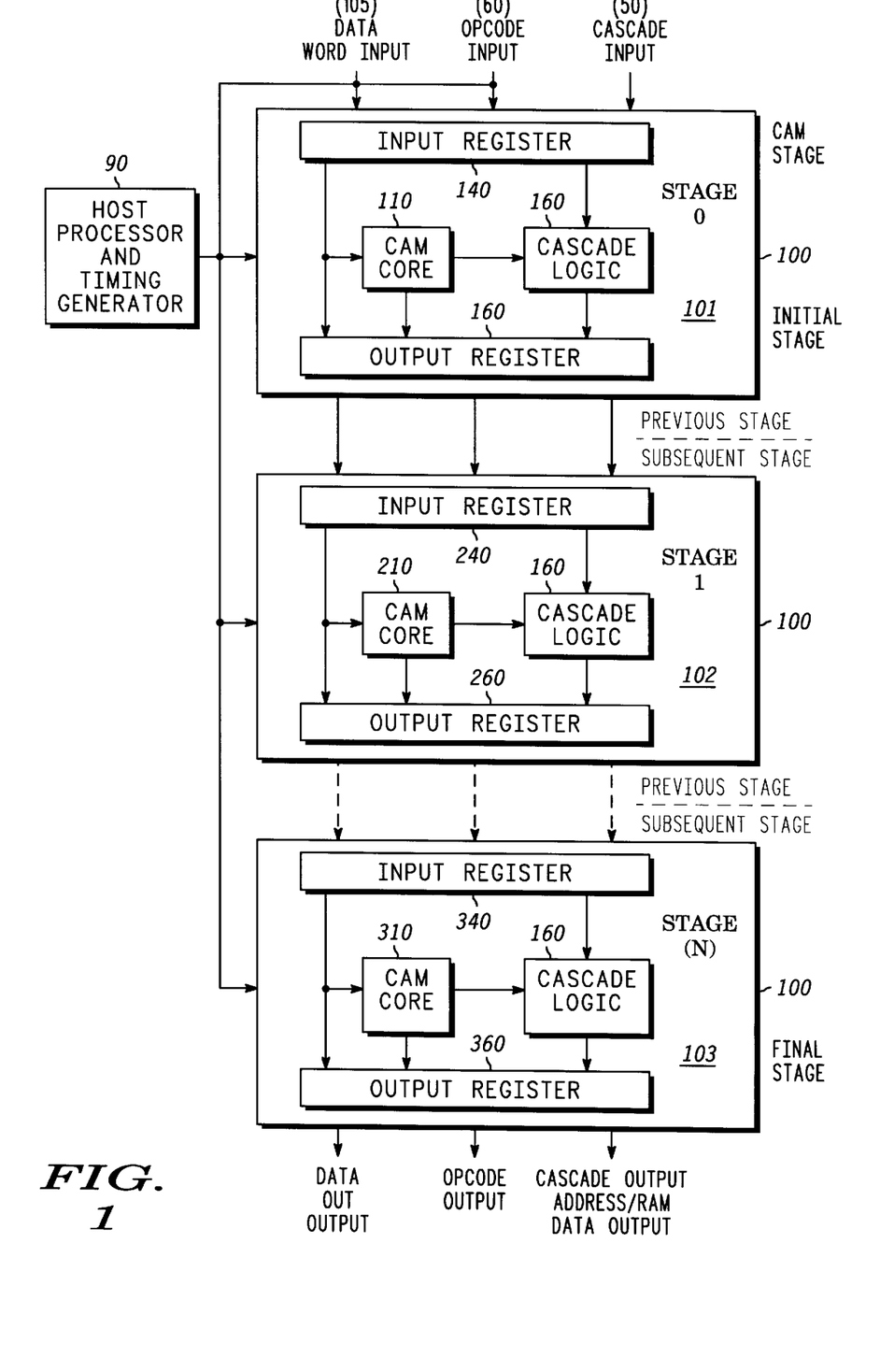
FIG. 1 shows a block diagram of a multiple stage pipelined CAM cascade system that includes a plurality of CAM chips, in accordance with one aspect of the present invention.

Referring to FIG. 1, a multiple stage pipelined CAM chip cascaded CAM memory system is illustrated, in accordance with one aspect of the present invention. In accordance with the present invention, a cascaded CAM system for processing incoming input data is provided. The memory system is comprised of a plurality of pipelined CAM subsystems 101–103, coupled together in a cascaded chain of stages, as shown. Data flows to an initial stage, then subsequent stages, and lastly to a final stage.

Each stage is comprised of a CAM core (e.g., 110), an input register (e.g., 140), an output register (e.g., 150), and cascade logic (e.g., 160). The input register receives the incoming data that includes a data word, cascade data, and op code data, which are each described later. The CAM core is comprised of content addressable memory for storing predefined data at addressable locations and comparing subsequent incoming data to the stored predefined data. The cascade logic creates a composite history of important parameters determined by activity in preceding stages. The output register is coupled to the cascade logic and the CAM core to provide outputs to the successive stage. The output is comprised of a data word, an op code output, and a cascade output from the CAM core and the cascade logic, as later described. The CAM core associates the stored predefined data in the CAM core with the incoming data word, and, responsive to determining a match between a content addressable memory location of the CAM core and the data word, produces an address location responsive to the op code data.

The cascade interface logic indicates whether a match has occurred anywhere in the CAM core, and whether multiple matches have occurred. The address location represents the lowest order address where a match was found in the CAM core. If no match has occurred, the CAM core provides an output of an address for a next location after a last matched location within that subsystem summarizing the data output, the op code output, and the cascade output from each of the CAM subsystems are coupled to the data input, the op code input, and the cascade input, as the incoming data, to the input register of the subsequent CAM subsystem.

The initial CAM subsystem has its cascade data and op code input data signals coupled from an external host processor, and the initial subsystem has its cascade inputs coupled to a predefined set of signals (in a preferred embodiment all zeros). The system also has a timing subsystem for providing synchronizing signals to all CAM subsystems. This ensures pipelined transfer of at least part of the input data between the CAM subsystems. The Cascade CAM system also provides multiple matching address locations when the user requests addresses for all the matched locations. The system logic-OR's on a bit-wise basis, the associated RAM data for all of the multiple matching locations. In accordance with the present invention, a cascadable pipelined content addressable memory subsystem accepts input CAM data, RAM data, Op code data, and Cascade data. The system has an input register for storing and outputting the input CAM Data, RAM Data, Op code data, and Cascade data. The system feeds a CAM core comprised of CAM memory locations and associative RAM memory, and a CAM comparator. The cascade data inputs are a cascade logic subsystem coupled to the input system for combinationally determining cascade conditions and for providing an output of cascade conditions, responsive to the input CAM data.

Data word (105) is loaded by a host processor (90) into stage 0 (101). Incoming data words (105) and op code (60) are loaded into an input register (140). In operation, a host processor (90) supplies a write instruction as an op code input (60) to stage 0 (101) synchronized by the timing generator. Each input data word (105) is clocked through the system pursuant to the host processor's op codes (60). The op codes (60) provide a command set which controls the operation of the CAM. The op code (60) for normal operation includes commands such as:

RESET: command used to initialize the CAM device. This clears out all of the entries and internal registers and is ready for programming after a power-up condition.

MASK: command used to load a bank of internal registers that are subsequently used in the binary-to-ternary conversion process. Bits that are set in the mask registers will be converted to an "X" when stored in the memory array, or set to an "X" during a subsequent search operation.

SEARCH: command executes the primary function of the CAM chip. This command compares each word in the CAM array to the Data Input to determine if any matches are present. If there is a match or a multiple match condition, the lowest matching address will be enabled.

NEXT: command used to determine the address of the next matching location when multiple matches are present. The Next command must be executed immediately after the search command and must contain the identical search parameters to obtain a valid result.

DELETE: command used to individually remove entries programmed into the CAM device. After a specific entry in the CAM is no longer required, the Delete command is used to remove it from the CAM tables. All other entries remain valid in the CAM memory space.

NOP: command used when no other operation is to be executed. This can be used while the system is waiting for additional commands or data from the system. No operations are executed for this command.

Referring again to FIG. 1, each intermediate stage (i.e., those except the initial and final stages) has its cascade inputs and outputs coupled to previous and successive stages, to form a cascaded CAM pipeline. The cascade input (50) receives data from previous cascade stages, such as handshaking, matching address data and its associated RAM data produced by the preceding CAM stage. Since stage 0 (101) has no preceding stages, all cascade inputs to stage 0 are normally grounded.

Each successive stage is fed by the output of the previous stage. The basic data channels, data words, op code, and cascade signals are maintained through each CAM stage (101, 102, 103). In the preferred embodiment, the data word (105) is fed forward unaltered. However, in other embodiments, RAM contents or other data may change it. The op code (60) is fed forward unaltered unless interrupted by an overriding command. The op code (60) represents commands for unique functions in each of the subsystems. An overriding command may be produced by the CAM device, such as write disable, or by the host processor, such as a reset. In the preferred embodiment, if a RAM chip's memory buffer gets filled, the CAM chip will output a write disable as part of its op code to notify a down stream chip of a change in priorities.

The cascade logic (160) updates its data in real time, continuously. The cascade logic (160) processes the cascade data in parallel with the CAM core (110). When a data word (105) enters the CAM core portion (110) of stage 0, the data word is compared to the contents of the CAM, searching for a match. The cascade logic is updated responsive to finding a match, and utilizes its associated data. The cascade logic receives previously resolved data, a base address, whether a valid address has been found, and whether more than one CAM match has occurred. In a preferred embodiment, each CAM stage (101, 102, 103) is capable of supplying 2k of CAM memory words with which the data word (105) is compared. The successive CAM stages utilize what the previous CAM stage has found. The last stage of the pipelined cascaded CAM system (102) outputs the first match found, or the lowest ordered address, and the composite OR-ed associated RAM data from every match which occurred in the system. Continuous real time parallel processing of the cascade logic with the CAM compare function allows sequential processing of data words. When the pipeline is full, a different data word exists in each stage. During each clock cycle, a data word enters the first stage as another exits the system. In this manner, a high speed data rate can be sustained, where a new multiple-stage-search-result is provided every clock cycle. Thus, an N-stage pipeline will take N clock cycles to fill the pipeline and give the first match output results. However, thereafter, a new N-stage processed match output is provided on each clock cycle, and providing zero variation latency and high speed communication.

Figure 2:
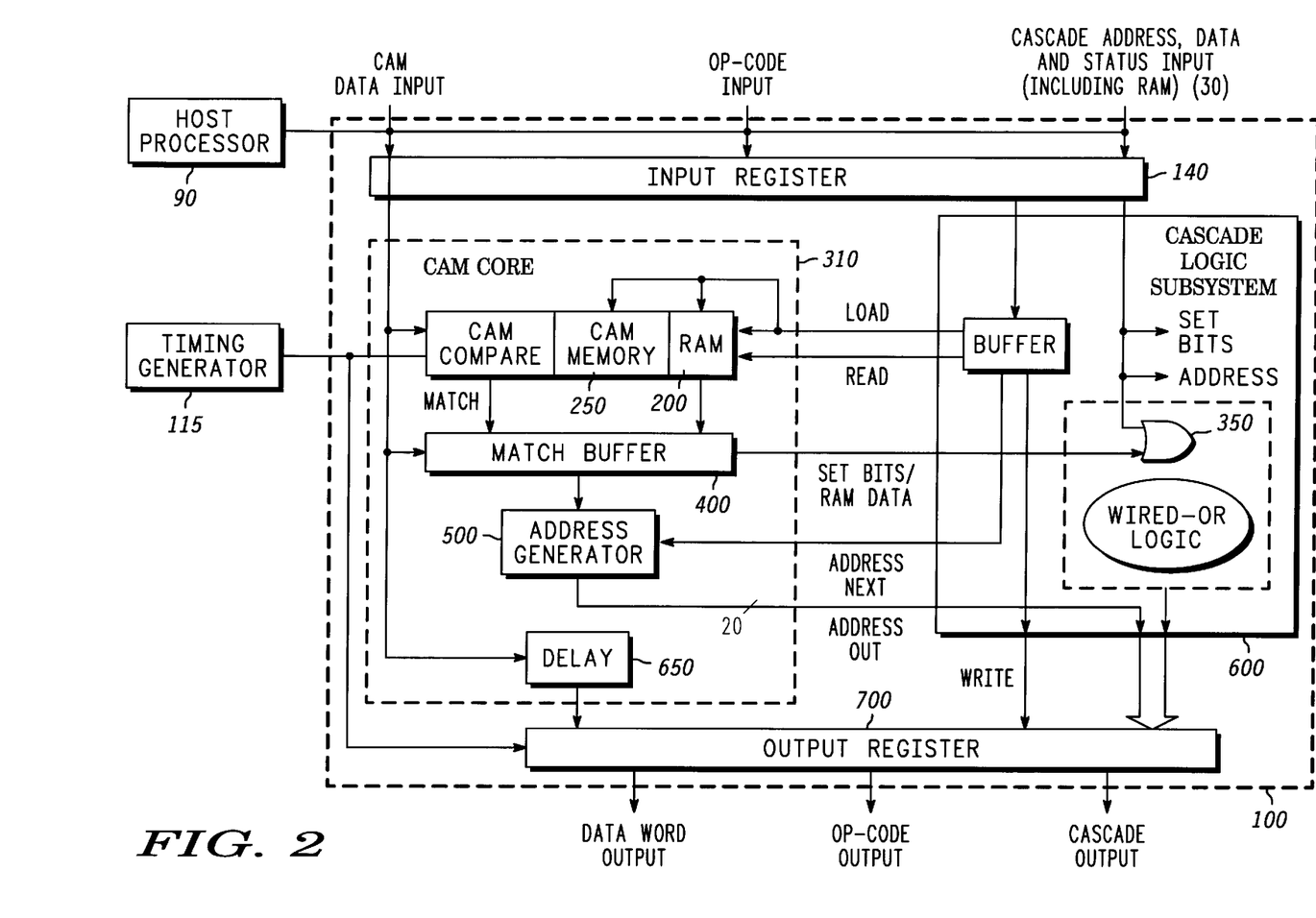
FIG. 2 shows a block diagram of one embodiment of the plurality of CAM chips of FIG. 1.

Referring to FIG. 2, showing a single CAM stage, the host processor (90) starts the pipeline process by producing a search command synchronized by the timing generator. In the preferred embodiment, the data is converted from binary-to-ternary data between the input register and the CAM core to allow for multiple matches within the CAM core. The search command clocks the data word into the input register (140) and starts a CAM compare cycle of the CAM stored data with the input registers, which produces an output from the CAM core.

In a preferred embodiment, each CAM memory location (250) which consists of 64 bits, has associated with it 16 bits of RAM (200) (companion RAM) and a match buffer (400). The match buffer (400) is used to record if a match at that CAM location occurs. Each CAM location has a physical address associated with it. Each matching CAM location produces its corresponding RAM data (200), which is bit-wise wire-OR'ed with the previously developed and incoming RAM data (30). The incoming RAM data is the wire-OR'ed RAM contents of all preceding matched CAM core locations. The companion RAM can be used for numerous purposes, such as security functions.

The wire-OR'ed RAM data is wire-OR'ed in the logic (350) in each stage (device) throughout the pipelined system to produce a composite wire-OR'ed RAM value. The system also allows the user to see any and all of the addresses that produced the final wire-OR'ed companion RAM data with a NEXT op-code instruction. The NEXT instruction can be used, for example, in troubleshooting.

In the case where no match is found in a CAM stage (100), the output of the CAM stage places its highest address location in the cascade output. This address is called the base address. The subsequent stage starts its address locations where the previous stage left off. In the preferred embodiment, each CAM stage contains 2048 addresses. If no match occurs in stage 0, stage 0 will output 2048 as a cascade output address. If no match occurs as of stage 1, stage 1 will output 4096; then stage 2 will output 6144; and so on.

Figure 3:
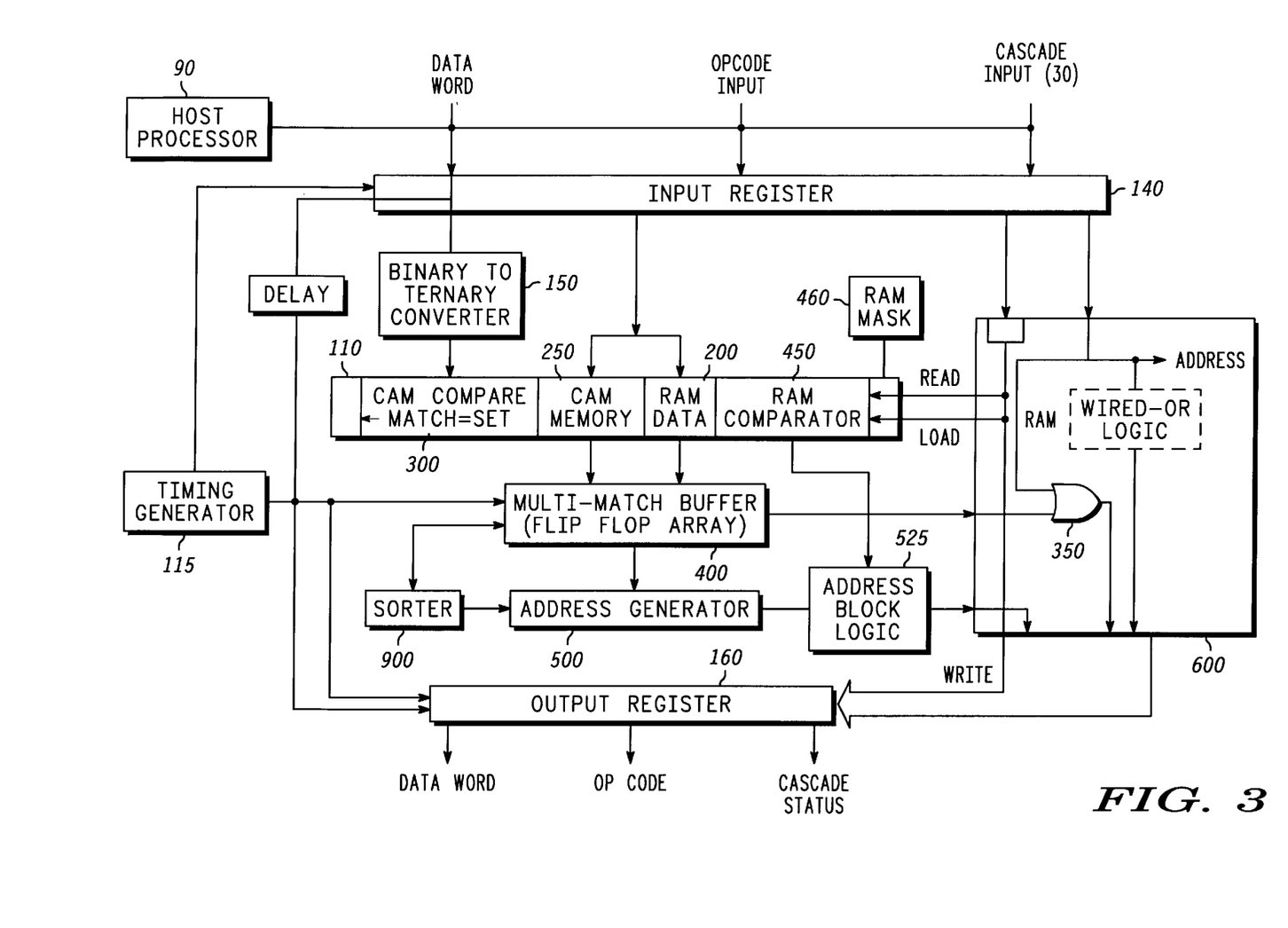
FIG. 3 shows a block diagram of an alternate embodiment of the plurality of CAM chips of FIG. 1.

Referring to FIG. 3, in a preferred embodiment, the data word (105), as initially input, is converted from binary-to-ternary in the binary-to-ternary (B/T) converter (150) pursuant to control logic, as illustrated in Table 1 below, prior to any CAM compare operations. This conversion allows user input masking. Masking of bits allows certain bit compares to be "don't cares". Masking is very important in most lookups, as well as sort and filtering functions that use CAMs, such as address resolution, password security (e.g., encryption and decryption), Virtual LAN groupings, asynchronous transfer mode (ATM) addressing (VPI/VCI) resolution, etc. Special op-codes are available for loading CAM data into the CAM memory (250) and mask data into the RAM mask registers (460), of the CAM core (100).

Subsequent comparing of input data to the stored ternary data is accomplished pursuant to control logic, as illustrated in Table 2, also below. Parallel masking (460) and cascade logic (600) allows sequential processing of the data words through the overall pipeline system and pipelined operation within the CAM core subsystem (100). Other alternative embodiments can store binary data in a binary CAM, and providing separately for masking of each compare within the CAM core (110).

Table 1 illustrates the binary-to-ternary conversion;

TABLE 1

| Write Table (B -> T Conversion) | | | | |
|---|---|---|---|---|
| Ternary | A | B | RA | RB |
| "N" | 0 | 0 | 1 | 1 |
| "1" | 0 | 1 | 1 | 0 |
| "0" | 1 | 0 | 0 | 1 |
| "X" | 1 | 1 | 0 | 0 | while Table 2 illustrates how ternary data is compared.

TABLE 2

| Matching Table (Write = 0) | | | | | |
|---|---|---|---|---|---|
| Ternary | A | B | RA | RB | MA |
| "X" | 0 | 0 | X | X | 1 |
| "1" | 0 | 1 | X | 0 | 1 |
|  |  |  |  | 1 | 0 |
| "0" | 1 | 0 | 0 | X | 1 |
|  |  |  | 1 |  | 0 |
| "N" | 1 | 1 | 0 | 0 | 1 |
|  |  |  | Else |  | 0 |

Tables 1 and 2 show four ternary codes for conversion. The null state "N" is not used for writing or searching, and is used for precharge and test functions only. X's represent "don't cares" and provide a mask function. In a ternary conversion, each bit of incoming binary data is converted to multiple bits which are presorted.

Table 1 shows the ternary symbol (N,1,0,X), and the corresponding ternary data outputs A and B, and the corresponding memory cell outputs RA and RB. Table 2 illustrates the matching table, showing the ternary symbol (N,0,1,X), and the corresponding ternary data outputs A and B, plus showing the match output resulting from a comparison of the ternary code for the input data to the stored memory cell output data.

Referring to FIGS. 2 and 3, the converted data word enters the CAM core (110) and is compared in parallel with the contents of each CAM location. This is called the search process, which compares the data word against the contents of each CAM location using an exclusive OR function. Each CAM location normally contains user defined preloaded data. In the preferred embodiment, the data word is clocked through the compare in 40 ns by a timing generator (115). The ternary conversion of the preferred embodiment allows the CAM compare to find a plurality of acceptable matches for a single data word input.

In the preferred embodiment, if a match is found in the CAM core, the CAM compare and flip flop in the multi-match buffer (400) associated with the CAM core is set. Within each stage, a sorter (900) ascertains the lowest order address corresponding to set flip flops in the multimatch buffer (400). The sorter (900) activates the multimatch buffer (400) and the address generator (500) to produce the lowest order CAM core address corresponding to a set flip flop. The ADDRESS VALID bit in the cascade logic (600) is set after the lowest order address is placed in the cascade logic output register for the pipeline output stage. The cascade logic ADDRESS VALID bit is not reset as it moves through the pipeline system. When a lowest order match address is identified, the activated multimatch buffer (400) is loaded with the corresponding RAM data from the CAM core. In a preferred embodiment, during a search command, the address of the matching CAM core location is inhibited and not produced by the address generator (500) and sent to the cascade logic (600) if the ADDRESS VALID bit from the previous chip in the cascade is set. If the ADDRESS VALID signal is not set, the address generator (500) generates the physical address of the data word/CAM match location and sends it to the cascade logic.

Figure 4:
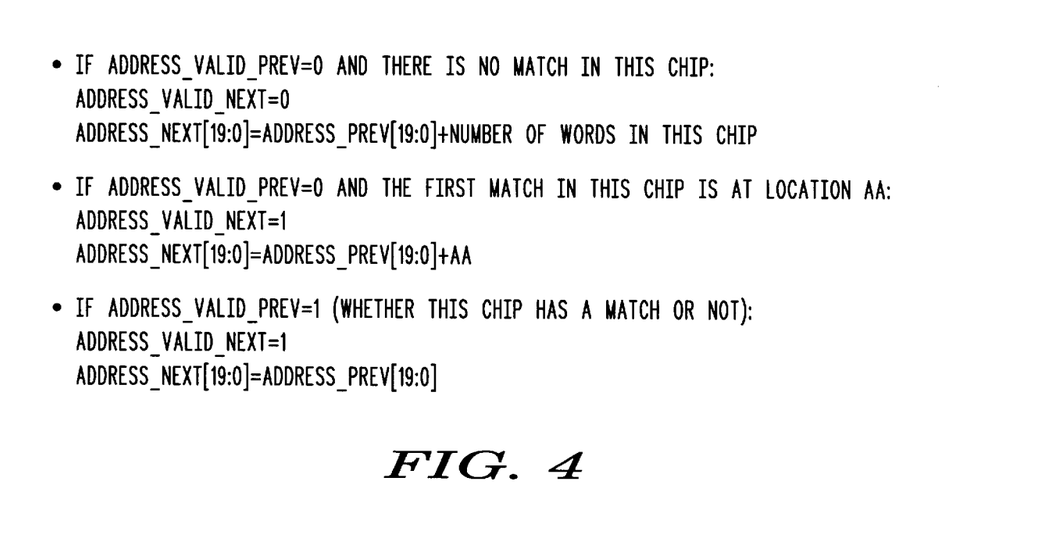
FIG. 4 illustrates a preferred embodiment of the cascade address generation logic used in each CAM chip, in accordance with one aspect of the present invention.
Figure 5:
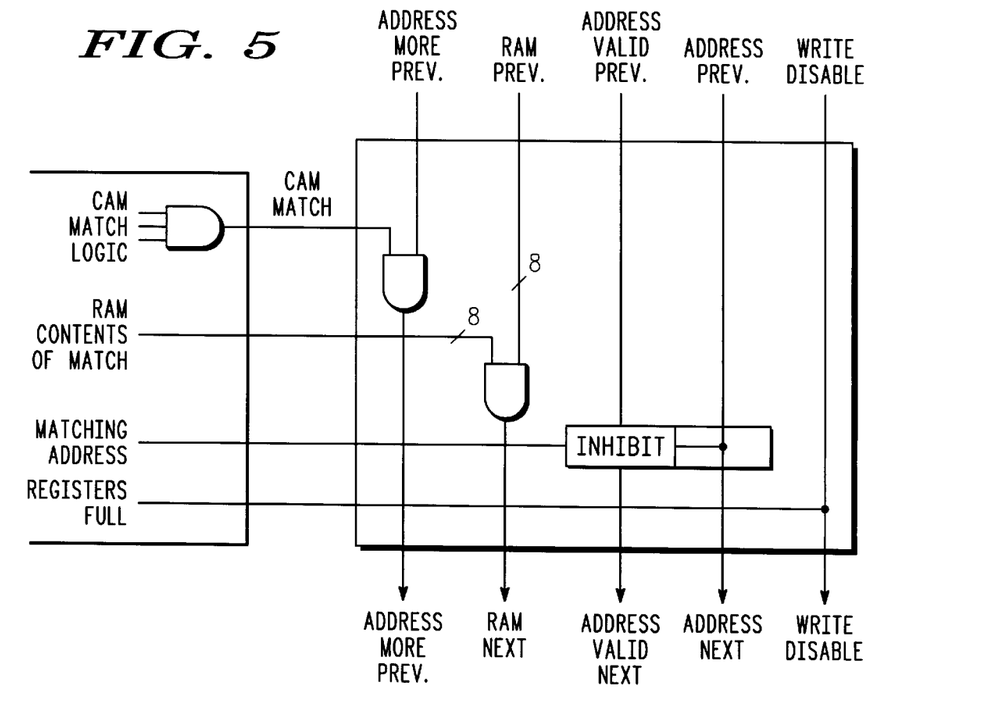
FIG. 5 illustrates a block diagram of the address calculation logic, in accordance with one embodiment of the present invention.

FIG. 4 illustrates a preferred embodiment of the algorithm for producing unique CAM stage cascade output addresses in a multi-stage system, according to the invention. If a match is found between the input register (140) data word and the CAM contents, the cascade logic (600) operates pursuant to an algorithm, such as in FIG. 4. The cascade logic places the proper address in an output register (700) to communicate with the next stage output or as a final stage output. FIG. 5 shows the flow through of the cascade logic and possible inputs which update the data as it flows through a stage, in accordance with the present invention.

Referring to FIGS. 4 and 5, each stage of the pipeline generates a unique address for matches (without an initial configuration setting, such as strapping). This is attained by passing a base address signal and an address valid logic signal from a previous chip to a subsequent one. The base address is referred to as "Address next" in the code and logic shown in FIGS. 4 and 5. The base address output from one stage (a previous stage) is sent to a subsequent stage. The base address outputted is dependent on whether a match has occurred, as illustrated in FIG. 4.

To generate a unique address in a multi-chip (stage) system, the cascade logic in each chip must provide a logic to provide a cascade address output ("Address Next"). If the cascade address output from the previous stage ("Address_prev[19:0]") is not representative of a previous match ("Address_valid_prev=0") and there is no match in this chips, and then a signal of no valid match ("Address_valid_next=0") is provided, and the cascade address output from this chip is a new base address ("Address_next [19:01]"), where Address_next[19:0]=Address_prev[19:0]+Number of words in this chip. If the cascade address output from the previous stage ("Address_prev[19:0]) is not representative of a previous match ("Address_valid_prev=0") and there is a match in this chip, and the first match in this chip is at location AA, then a cascade output signal of a valid match ("Address_valid_next=1") is provided, and the cascade address output from this chip is Address_next [19:0]=Address_prev[19:0]+AA.

If there is a match in a previous chip (stage), then the signal "Address_valid_prev=1", and whether or not this chip has a match, this chip provides cascade outputs of "Address_valid_next=1", and "Address_next [19:0]= Address_prev[19:0]". This base address is computed by the previous stage using the previous address plus the number of words in the chip. Also shown is setting of the address valid if a first match is found and retaining address valid of address valid previous was set when incoming.

Figure 6:
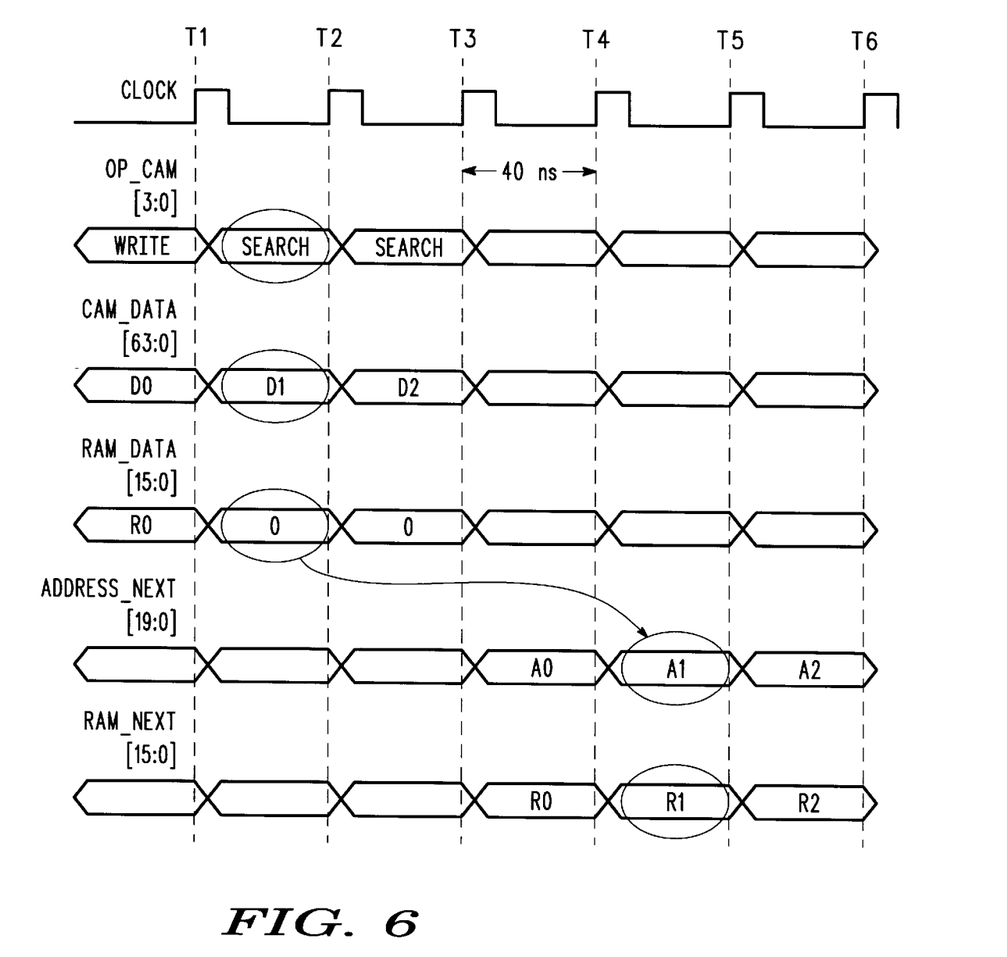
FIG. 6 illustrates a timing diagram associated with a multiple stage multiple-CAM chip, showing the timing of the first two stages of FIG. 1.

FIG. 6 shows, in accordance with the present invention, a simplified example of a pipelined ternary CAM timing diagram, showing just the main input and output. The diagram shows a write operation followed by two search operations. The address of the written or matched word is shown on ADDRESS NEXT with its associated RAM contents on RAM next, as shown. The internal pipeline delay results (e.g., A1 or T5) for three cycles after loading the data and operations (e.g., 01, search at time T2) for each additional PT CAM chip, the result is delayed one additional clock cycle per chip, although remains unchanged.

As discussed above, when the present invention is used in a ternary system, multiple matches can occur within one chip and multiple flip flops may be set. The search command causes the CAM subsystem to set the associated flip flops within the multimatch buffer (400) when a hit occurs. If multiple matches occur in stage 0, the stage 0 (of FIG. 1) will feed forward only the lowest order address on the cascade logic output. If the ADDRESS VALID bit is set in the cascade data (50), subsequent matches only set selected flip flops corresponding to the match locations, and output the associated RAM data for a wired-OR function by logic (350) shown in FIG. 3. Down the pipeline (e.g., stage 1), if the ADDRESS VALID bit is set, and yet another match occurs, each subsequent CAM stage ignores all match addresses and feeds the lowest address forward to the subsequent CAM stage. Ultimately the lowest order matching address is output.

In the preferred embodiment, when more than one match is found, a bit in the op code is set called ADDRESS MORE. The NEXT command from the host processor clocks out data such as the address for each match location subsequent to the lowest addressed match. This allows the user a means for finding out exactly where the multiple matches occur when an ADDRESS MORE present. This option is useful in diagnostics, particularly since it allows the user to find out the origin of the RAM output contents.

In one embodiment, as illustrated in FIG. 3, address blocking logic (525) is provided. If a match is found, the associated stored RAM data is wire-OR'ed, but its corresponding addresses availability can be barred. Concurrent with the data word compare, the input RAM data is wire-OR'ed to the output RAM contents. In the preferred embodiment, the comparison function includes greater than, less than, equal to, not equal to, and combinations thereof. The compare and its features are responsive to the op code. The op-enable instruction would disable the address generation for a CAM data match regarding a successful compare of CAM data.

The contents of the RAM can be used to selectively enable addresses in the CAM. One application would be where the user wanted to modify the wired-OR RAM output values in a multiple match condition, but not output the address of this RAM modifier data (e.g., as in an ATM application). A second application would be in a hierarchical searching, or searching by groups. The RAM data could be partitioned into groups, so that when a search was performed, it would only look at CAM data entries with RAM data equal to a specific group, or greater than/less than to include multiple groups.

In the preferred embodiment, all CAM chips have a reset to clear all flip flops and return the chips to a known initialization state. Certain data, such as the unaltered input data word passing through the pipeline, must be delayed to keep pace with the corresponding data package. This is accomplished with delay logic, such as flip flops (650). Once the initial propagation delay, or number of clock cycles required to get through the CAM (stages 1, 2, and 3 of FIG. 1), is achieved, the system thereafter produces complete comparison match results on every clock cycle thereafter, assuming that the pipeline is kept full.

Figure 7:
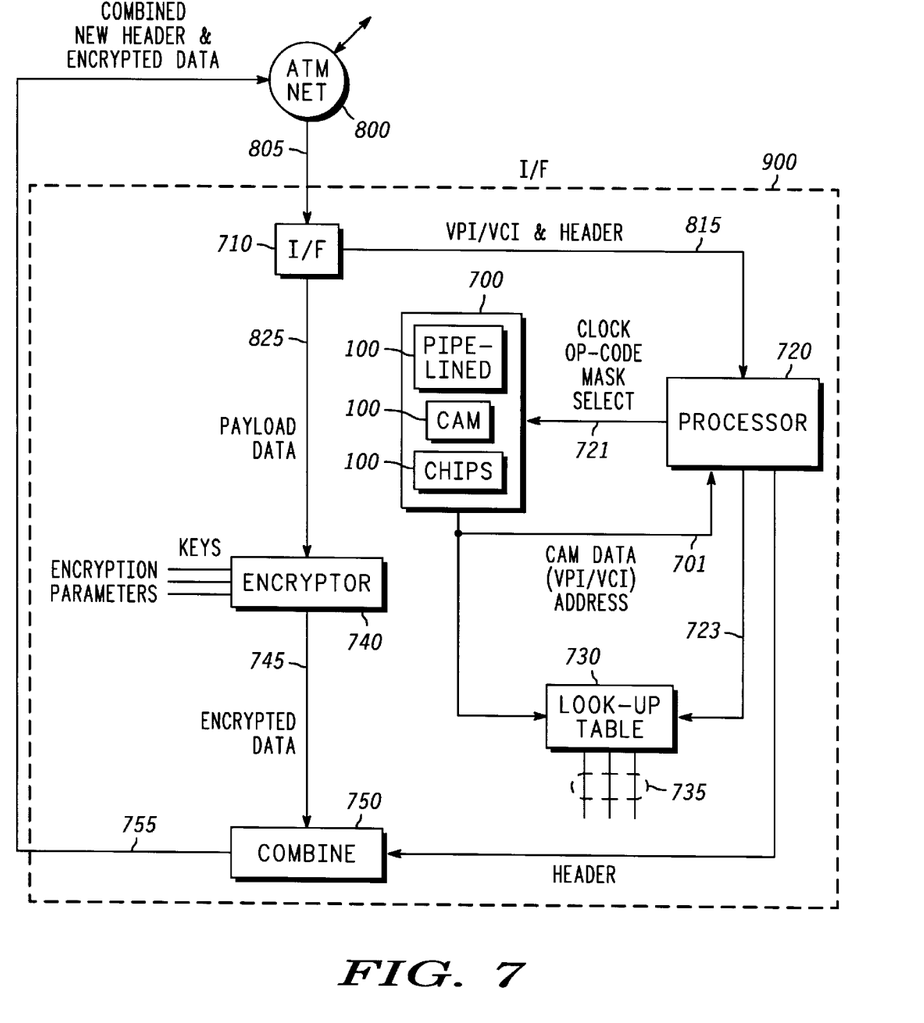
FIG. 7 illustrates an ATM network embodiment utilizing the CAM memory system, in accordance with the present invention.

Referring to FIG. 7, the memory system of the present invention is illustrated in an address routing-based encryption embodiment for use in conjunction with an ATM switching system. During an initial call setup, the ATM network 800 provides for communication of information coupled via bus 805 to interface 710 to establish a call setup procedure prior to performing a write operation. The system 900 provides for storing of new ATM virtual address (Virtual Pipe/Virtual Chann or VPI/VCI) link data to be setup and stored into the CAM memory array of memory system 700 by doing the CAM Write cycle process. It should be noted that either binary or ternary CAMs can be utilized, in accordance with the present invention, as relates to the pipelined cascadable CAM architecture.

In accordance with a preferred embodiment of the present invention, a ternary CAM system is provided that provides for ternary information being written into the ternary CAM cells in a single Clock cycle, which allows for the writing of a continuous stream of ATM messages coming through, instead of having to stall or delay the ATM system, to facilitate a multiple cycle ternary CAM Write with risk of cell loss. In typical applications, an entire block of VPI/VCI link translation address information is setup in the CAM memory cells, the lookup table, and the internal RAM if present, all in one continuous set of operations rather than just one location. A real-time communication network is thereafter provided.

After initial setup, communications from the ATM net 800 via coupling 805 is made to an interface 710, which strips off the VPI/VCI portion of the header from the payload and remaining header potion of the ATM cell, and sends the VPI/VCI and remaining header, via coupling 815, to the processor 720. The processor 720 provides the appropriate Clock, Op code, Mask Selects, CAM data, and other appropriate input signals via coupling 721 to the CAM memory system 700. The CAM memory system 700 is comprised of a plurality of cascaded pipelined CAM memory systems of the type discussed elsewhere herein (e.g., see FIGS. 1–3). After setup is complete, the CAM search (and lookup table) can be utilized.

The CAM Data from the processor, which is requesting a compare, is the stripped-off VPI/VCI portion of the header, which is compared to the contents of the CAM memory 700, which in turn provides an address output 701 when a match occurs. The address output 701 is coupled back to the processor 720 and to a lookup table 730. During setup, the processor 720 loads the lookup table 730 with data, via coupling 723, corresponding to the Address output of the CAM 700. The lookup table 730 outputs specific encryption parameters 735 responsive to the address output of the CAM memory system 700. The lookup table 730 provides the encryption parameters 735, which can be a unique key or some mechanism that sets up an encryptor 740. The encryption parameters 735 are coupled to the encryptor 740, which is also coupled to receive the payload data portion of the cell 825, as provided by the interface 710. The encryptor 740 then encrypts the payload data in accordance with the specific encryption parameter keys as provided by the lookup table 730, which are uniquely associated with the specific VPI/VCI address that was input as CAM Data into the CAM system 700. The encrypted data output 745 from the encryptor is coupled to a combiner 750, which recombines the encrypted data of the payload with the header, including the VPI/VCI address, and provides a combined new cell comprising the header and encrypted data as output at 755 for coupling back to the ATM network 800 for communication therefrom to the appropriate destination.

The lookup table 730, while illustrated external to the CAM memory system 700, can alternatively be provided as a part of the CAM memory system 700. However, to provide sufficient encryption parameters, it is desirable to have more than a 16-bit wide amount of RAM. Thus, to maintain cost effectiveness of the CAM memory chips of the memory system 700, the lookup table can be provided externally and addressed responsive to the address output from the CAM memory system 700, to add flexibility to the system design. The RAM within the CAM chip itself, where present, can be used to provide sync pulses, end-of-frame indicators, and many other simpler functions than the encryption parameters, and can be provided in addition to the lookup table 730. Thus, the presence of the RAM within the CAM memory system 700 is optional, and if present, can be supplemented by an external separate lookup table. Since not every CAM address needs to have a lookup table encryption, an external lookup table can be used with a much denser lookup function than an on-chip RAM. In one embodiment, the RAM is on-chip within the CAM memory system 700, and the lookup table is integrated internally, eliminating the need for the external lookup table 730.

The lookup table is loaded as appropriate, corresponding to the CAM cell loading, via the processor 720, monitoring when a write operation is performed into the CAM memory 700, and then providing an address output 701 from the CAM, which indicates the memory location that is actually written to. Subsequent to that, the processor 720 takes the appropriate action to load in the lookup table an appropriate mapping of the encryption parameters as necessary to support that VPI/VCI address. Even where the lookup table is in RAM internal to the CAM memory system 700, the processor still monitors and rewrites into the RAM appropriately to load the encryption parameter data needed. The processor 720 provides the Mask Select, Data Input, the Op code Data input, the Clock, and other necessary parameters for use by the CAM memory system 700. The processor 720 processes the VPI/VCI and remainder of the header, and determines the next appropriate step. In the preferred embodiment, the VPI and VCI portion and the remainder of the header are typically not encrypted or transformed by the encryption system as illustrated in FIG. 7, and are recombined with the encrypted data by the combiner 750. Alternatively, the VPI/VCI could be remapped via the processor and VPI/VCI mapping contained either within the CAM system 700 as RAM or utilizing another external memory system, to provide a new VPI/VCI address to be recombined with the remaining original header and the encrypted data.

The encryptor 740 provides a method of scrambling the input data based on certain encryption parameters, which can be any sort of scrambling and encryption, such as keys for a specific user path. The encryption parameters in the lookup table are thus loaded in accordance with some predefined encryption algorithms to provide the necessary parameters for the encryptors 740. The keys are loaded as appropriate, so that each respective VPI/VCI address has associated with it its own key, or no key, so that the corresponding destination address system can decode the encrypted data on the other end with that unique key. The lookup table must provide the appropriate equivalent key, so the encryptor encodes the payload data in accordance with the key that is going to be used on the other side when the payload data is decoded.

During the initial call setup from the ATM network, messages are passed back and forth to define what keys (e.g., encryption parameters to be stored in the lookup table) can be used, what algorithms, which VPI/VCI locations have access, and various other parameters that can be defined for the encryption process. An agreed-to initial key can be used to encrypt the initial data that is sent with a common public key that all users have, and thereafter, private keys are utilized for encryption and decoding. The private key is unique for a VPI/VCI pair, although multiple VPI/VCI pairs can have the same key. The processor 720, responsive to the loading of the CAM, provides for loading the lookup table with the corresponding keys for certain addresses in response to communications from the ATM network 800 of key values for certain VPI/VCI addresses. The interface 710, the ternary CAM memory system 700, and the processor 720 provide translation of the VPI/VCI addresses to addresses for encryption keys for the respective VPI/VCI addresses, responsive to the ternary CAM 700 output 701. The output 701 provides the addresses to the lookup table 730 which provides the encryption parameters 735 as necessary to encrypt the payload data 825 by the encryptor 740. The encryption payload data is combined by the combiner 750 with the header for output 755 to the ATM network 800.

The ATM system benefits by utilizing off-loaded key encryption of payloads, based on address routing information (e.g., VPI/VCI), which is first stripped, and after encryption, re-appended from/to the payload. This encryption of payloads can be performed transparently to the ATMs' other network operations. The combined data cell (encrypted payload and header) can now be securely communicated through public ATM networks. Since the header is non-encrypted, the combined data cell can be re-routed in commercial switches, routers, and bridges. However, since the data is encrypted, only a receiver with the correct encryption key table can de-encrypt the payload, thus securing communication of the payload. On the receiving side, the same associative lookup/mapping is used to determine the encryption keys, and the encrypted payload is de-encrypted using the encryption keys.

These benefits can also be utilized by other communications schemes, where a portion of the cell or packet is stripped off, encrypted, and then recombined for transmission, switching, routing, reception, and decrypting.

In accordance with one aspect of the present invention, the addresses, data, and associated data for multiple matches in one chip are processed simultaneously and sequentially, and CAM chips are not idle for contiguous and continuous clock cycles, nor do they require external glue logic.

This pipelined configuration yields a consistent latency regardless of where a match is found. In accordance with one aspect of the present invention, a zero latency variation and a zero variation cell delay are provided. The final output from the cascaded CAM system requires the same fixed number of clock cycles (relative to the time of input) to reach the output, regardless of where or when in the cascade a match is found.

In accordance with another aspect of the present invention, a ternary CAM system provides efficient multimatch resolution. Multimatch resolution increases speed and decreases size.

In accordance with a further aspect of the present invention, associated stored data is supplied to supplement the CAM match in parallel operation, allowing vast flexibility in system design.

ATM typically requires more CAM mapping storage than a single chip or stage can provide. Therefore, multiple CAM chips (stages) must be cascaded. The prior art cascading of multiple CAM chips resulted in delay between cells. Since delays in data transmission in ATM (and other) systems results in cell loss, encryption and other masking schemes must be transparent, that is, no delay inserted. The pipelined cascadable CAM subsystem in accordance with the present invention and the pipelined system created by a plurality of the subsystems in accordance with the present invention provide the benefits of pipelined elimination of delays, both at the subsystem architectural level and at the cascaded system level.

What is claimed is:

1. A content addressable memory (CAM) system for processing incoming input data, comprising:

an input register for receiving the incoming input data, the incoming input data comprising a data word, cascade data, and op code data;

a CAM core comprising means for selectively storing certain of the incoming input data as stored CAM data at addressable locations and means for comparing incoming data to the stored CAM data;

cascade logic responsive to the incoming input data;

an output register coupled to the cascade logic and the CAM core, for providing output register outputs of a data output, an op code output, and a cascade output, responsive to the CAM core and the cascade logic; and means for determining a match between the stored CAM data of the CAM core and the incoming input data, and for producing a match address location;

wherein the cascade logic is further comprised of cascade interface means for providing the cascade output indicating whether a match has occurred anywhere in the CAM core, and whether multiple matches have occurred, and the match address location representing a lowest order address where a match was found in the CAM core, and when no match has occurred for providing an output of the match address location of an address for a next location after a last addressable location within the CAM subsystem.

2. The CAM system as in claim 1, wherein the input register, the CAM core, the cascade logic, and the output register in combination form a CAM stage;

wherein there are a plurality of the CAM stages, coupled together in a cascaded chain of CAM stages comprising an initial stage, and subsequent stages at least including a final stage; and wherein the plurality of the CAM stages comprise a pipelined system, wherein the output register for the final stage provides the output register outputs corresponding to a complete pipelined system CAM comparison for the incoming input data.

3. The CAM system as in claim 2, further comprising:

means for providing input CAM data, RAM data, Op code data, and Cascade data to the initial stage; and timing means for providing synchronizing signals to the plurality of CAM stages to effectuate pipelined transfer of at least part of the input data between a plurality of the CAM stages.

4. The CAM system as in claim 1, wherein each of the data output, the op code output, and the cascade output from each of the plurality of CAM stages are coupled to the data word, cascade data, and op code data as the incoming input data to an input register of a subsequent CAM subsystem stage.

5. The CAM system as in claim 1, wherein the initial stage has its cascade data and op code input data signals coupled from an external host processor, and the initial stage has its cascade inputs coupled to a predefined set of signals.

6. The CAM system as in claim 5, wherein the predefined set of signals are a logic low level.

7. The CAM system as in claim 1, wherein the cascade logic further comprises means for providing multiple matching address locations responsive to the op code input data.

8. The CAM system as in claim 1, further comprising:

a RAM memory, for selectively storing and retrieving RAM data as associated data at locations addressable by associative mapping to respective corresponding CAM address locations in the CAM; and means for logic-OR'ing, on a bit-wise basis, the associated data for multiple matching address locations.

9. A cascadable pipelined content addressable memory CAM system responsive to input CAM data, RAM data, Op code data, and Cascade data, the CAM system comprising:

an input register for storing and outputting the input CAM Data, RAM Data, Op code data, and Cascade data;

an output register;

a CAM core comprising CAM memory having a location associative RAM memory, and a CAM comparator;

wherein the input CAM data is first coupled to the input register, and then coupled to the CAM memory, and then coupled to the output register;

wherein the cascade data derives from a cascade logic subsystem coupled to the input register for combinationally determining cascade conditions and for providing an output of cascade conditions, responsive to the input CAM data;

means for comparing the input CAM Data to each and all individual CAM memory location contents responsive to the Op code data;

a multimatch buffer for storing a matching CAM location responsive to detecting a match and responsive to the Cascade data and coupled to the input register; and a cascade logic subsystem determining cascade conditions and for providing an output of cascade conditions, responsive to the multimatch buffer.

10. The CAM system as in claim 9, wherein the cascade logic subsystem is further comprised of means for wire-OR'ing the RAM data for all associated matched locations with the cascade data from a previous stage to produce a wired-OR output.

11. The CAM system as in claim 10, wherein the output register provides a time-delayed version of the input CAM data, and provides a cascade output representative of the wired-OR output, and indicative of cascade conditions based on operations occurring within the CAM system, and outside the CAM system.

12. The CAM system as in claim 9, wherein an output from the input register corresponding to the RAM data and the Op code data is coupled to the output register and provides a time delayed cascade output.

13. The CAM system as in claim 9, further comprising a binary-to-ternary converter coupled between the input register and the CAM memory of the CAM core;

wherein the input CAM data is converted from binary-to-ternary format before storing the incoming input data and before comparing the incoming input data to the CAM memory; and wherein the multimatch buffer is coupled to a RAM comparator output, wherein the multimatch buffer provides an output representative of all locations in the CAM where a match exists between the input CAM data and entries stored in the CAM memory.

14. A cascadable pipelined content addressable memory (CAM) system, the CAM system comprising:

an input register for receiving input data comprising input CAM data, Op code data, and Cascade data that includes status data and RAM data;

a binary-to-ternary converter coupled to the input register for converting the CAM data therefrom into ternary CAM data responsive to write and compare conversion logic;

a CAM core comprising an associated CAM memory for storing data at one of a plurality of memory locations each having a unique associated address, a CAM comparator, each memory location in the CAM core having a specific address, the CAM memory and the CAM comparator coupled to the binary-to-ternary converter;

a multimatch buffer comprising a plurality of flip flops for indexed storage and retrieval of data associated with each of the plurality of CAM memory locations; and a cascade logic subsystem determining cascade conditions and for providing an output of cascade conditions, responsive to the multimatch buffer wherein the CAM comparator compares the ternary CAM data to the stored data for all CAM memory locations responsive to the input op code data; and wherein an associated flip flop is activated for each CAM memory location found to be matching.

15. The CAM system as in claim 14, further comprising:

a sorter for determining a lowest order address, responsive to the multimatch buffer; and an address generator for generating an address output match responsive to the sorter.

16. The CAM system as in claim 15, further comprising:

means for outputting addresses for multiple ones of the address output match.

17. The system as in claim 15, further comprising:

an address blocker to block the address output match responsive to a compare by the RAM comparator between the RAM data and a preloaded RAM mask to prevent a matched CAM core address from reaching the cascade logic subsystem.

18. The CAM system as in claim 14, further comprising:

an output register for storing the cascade data and CAM data from the input register responsive to the Op code data; and means for transferring, after a time delay, the stored cascade data and CAM data as a next stage output.

19. The CAM system as in claim 14, further comprising:

means for inhibiting additional addresses from being accepted for input by the cascade logic subsystem.

20. The CAM system as in claim 19, wherein the means for inhibiting is further characterized as setting an address valid bit in the cascade logic subsystem.

21. The CAM system as in claim 14, wherein the cascade logic subsystem logically OR's each bit position for all the CAM memory locations found to be matching to produce a composite RAM value.

22. A memory system for implementing a secure ATM communication system for an ATM network that transmits a plurality of cells, each of the plurality of cells comprising payload data and header data comprised of VPI and VCI address data, the memory system being responsive to a plurality of Data Input signals, encryption VPI and VCI addresses, and associated key data signals, the memory system comprising:

a pipelined cascadable content addressable memory (CAM) subsystem for storing CAM data to produce stored CAM data and for comparing the plurality of Data Input signals to the stored CAM data, and for providing a match output address when one of the plurality of Data Input signals matches the stored CAM data;

an addressable lookup table subsystem for storing the associated key data signals and selectively outputting key data responsive to the match output address;

wherein the CAM subsystem and the addressable lookup table subsystem form a memory subsystem; and means for initializing the memory subsystem comprising:

means for storing the encryption VPI and VCI address data as the stored CAM data in the CAM subsystem;

means for storing the key data associated with the encryption VPI and VCI address data in the addressable lookup table subsystem;

means for separating the payload data from the header data for each of the plurality of cells;

means for coupling the separated header data to the CAM subsystem, wherein the CAM subsystem selectively provides the match output address when the separated header data at least partially matches the VPI and VCI address data stored in the CAM subsystem;

wherein the addressable lookup table provides an output of the key data associated with a respective match output address;

means for encrypting the payload data responsive to the key data; and means for combining the encrypted payload data with the separated header data to form an encrypted cell.

23. The system as in claim 22, further comprising means for transmitting the encrypted cell to the ATM network.

24. A memory subsystem for implementing a secure ATM communication system that transmits a plurality of signals, comprising encryption key data, and cells, each of the cells comprised of payload data and header data comprised of VPI/VCI data, wherein respective ones of the encryption key data is associated with respective ones of the VPI/VCI data, the memory subsystem comprising:

a content addressable memory (CAM) subsystem, comprised of a plurality of CAM stages, coupled together as a pipelined system in an intercoupled cascaded chain of the plurality of CAM stages comprising an initial stage, and subsequent stages at least including a final stage; and wherein each of the plurality of CAM stages is comprised of an input register, a CAM core, cascade logic, and an output register;

wherein the input register receives incoming data that includes a data word, cascade data, and op code data;

the CAM core comprising means for selectively storing certain of the incoming data as stored CAM data at addressable locations, and means for comparing the incoming data to the stored CAM data, responsive to the incoming data;

the cascade logic being responsive to the incoming data;

the output register being coupled to the cascade logic and the CAM core, for providing output register outputs that include a data output, an op code output, and a cascade output;

wherein the CAM core is further comprised of means for determining a match between the stored CAM data and the incoming data, and for producing a match address location output responsive thereto; and wherein the cascade logic is further comprised of cascade interface means for providing the cascade output indicating whether a match has occurred anywhere in the CAM core, and means for determining whether multiple matches have occurred, wherein the match address location output represents a lowest order address where a match was found in the CAM core, and when no match has occurred, means for providing an output of the match address location output of an address corresponding to a next location after a last addressable location within the CAM subsystem; and wherein the plurality of the CAM stages comprise a pipelined system, wherein the output register for the final stage provides the output register outputs corresponding to a complete pipelined system CAM comparison for the incoming input data.

25. The memory subsystem as in claim 24, further comprising:

an addressable lookup table;

a processor for storing VPI/VCI data into the CAM subsystem, each at a respective storage address, and for storing the respective associated encryption key data into the lookup table at a location mapped to the respective storage address;

a decoder for separating the header data from the payload data for each of the cells;

the CAM subsystem, providing means for comparing the stored data therein to the separated header data to selectively provide a match address output when the separated header matches any of the stored data therein;

wherein the lookup table is responsive to the match address output to provide an output of the associated encryption key data;

an encryptor, responsive to the encryption key data output from the lookup table for encrypting the separated payload data;

a combiner for combining the encrypted payload data with the separated header to form an encrypted cell; and means for communicating the encrypted cell through standard ATM infrastructure systems.

\* \* \* \* \*

UNITED STATES PATENT AND TRADEMARK OFFICE
CERTIFICATE OF CORRECTION

PATENT NO.: 5,930,359
DATE: July 27, 1999
INVENTOR(S): Kempe et al.

It is certified that error appears in the above-identified patent and that said Letters Patent are hereby corrected as shown below:

Please correct the name of the Assignee on the patent. Add the following company to the list of Assignees: Bell Communications Research, Inc. Accordingly, the above identified patent consists of two assignees: Motorola, Inc. (as already identified on the face of the patent); and, Bell Communications Research Inc. (the entity to be added pursuant to this certificate of correction).

Signed and Sealed this

Tenth Day of April, 2001

*Attest:*

NICHOLAS P. GODICI

*Attesting Officer*       *Acting Director of the United States Patent and Trademark Office*